(12) United States Patent
Huang

(10) Patent No.: US 12,135,045 B2
(45) Date of Patent: Nov. 5, 2024

(54) GAS CIRCULATION APPARATUS, GAS CIRCULATION METHOD, PNEUMATIC APPARATUS, AND SEMICONDUCTOR DEVICE

(71) Applicant: CHANGXIN MEMORY TECHNOLOGIES, INC., Hefei (CN)

(72) Inventor: Qing Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 479 days.

(21) Appl. No.: 17/454,240

(22) Filed: Nov. 9, 2021

(65) Prior Publication Data
US 2023/0041577 A1   Feb. 9, 2023

Related U.S. Application Data

(63) Continuation of application No. PCT/CN2021/112840, filed on Aug. 16, 2021.

(30) Foreign Application Priority Data

Aug. 9, 2021   (CN) .......................... 202110910384.0

(51) Int. Cl.
*F15B 11/064* (2006.01)
*F15B 13/04* (2006.01)
(Continued)

(52) U.S. Cl.
CPC ...... *F15B 11/064* (2013.01); *H01L 21/67017* (2013.01); *F15B 13/0402* (2013.01);
(Continued)

(58) Field of Classification Search
CPC ......... Y10T 137/2554; Y10T 137/2678; Y10T 137/86839; F15B 11/064; F15B 13/0402;
(Continued)

(56) References Cited

U.S. PATENT DOCUMENTS

| 2,606,571 | A | * | 8/1952 | Ernst | ...................... G05D 16/10 137/505.22 |
| 2,637,341 | A | * | 5/1953 | Borst | .................... F15B 13/044 91/464 |
| 3,566,903 | A | * | 3/1971 | Honeycutt | .............. F15B 13/02 91/464 |
| 3,608,431 | A | * | 9/1971 | Pease, III | ................ F15B 21/08 91/1 |
| 3,680,583 | A | * | 8/1972 | Clair | ................... F16K 11/0704 91/356 |

(Continued)

FOREIGN PATENT DOCUMENTS

| CN | 101655112 B | 11/2011 |
| CN | 110645227 A | 1/2020 |

*Primary Examiner* — William M McCalister
(74) *Attorney, Agent, or Firm* — Syncoda LLC; Feng Ma

(57) ABSTRACT

A gas circulation apparatus is applied to a pneumatic apparatus including a solenoid valve apparatus and a cylinder apparatus, and is connected in series between the solenoid valve apparatus and the cylinder apparatus. The gas circulation apparatus includes a valve core structure, a first circulation cavity, and a second circulation cavity. The valve core structure is configured to move in a first direction, so that compressed gas discharged from a first cylinder cavity of the cylinder apparatus and passing through the solenoid valve apparatus is collected and stored by the first circulation cavity, and a second cylinder cavity of the cylinder apparatus is supplied with compressed gas stored in the second circulation cavity together with the compressed gas supplied from the solenoid valve apparatus.

20 Claims, 15 Drawing Sheets

(51) Int. Cl.
*H01L 21/67* (2006.01)
*G05D 7/06* (2006.01)

(52) U.S. Cl.
CPC ............ *F15B 2211/30565* (2013.01); *F15B 2211/7053* (2013.01); *F15B 2211/8855* (2013.01); *G05D 7/0635* (2013.01); *Y10T 137/2678* (2015.04); *Y10T 137/86839* (2015.04)

(58) Field of Classification Search
CPC .... F15B 2211/30565; F15B 2211/7053; F15B 2211/8855; H01L 21/67017; G05D 7/0635
USPC .............................. 137/106, 119.02, 625.43
See application file for complete search history.

(56) References Cited

U.S. PATENT DOCUMENTS

| | | | | |
|---|---|---|---|---|
| 3,952,714 | A | * | 4/1976 | Weyer ..................... F02D 11/06 123/342 |
| 3,992,979 | A | * | 11/1976 | Smith ..................... F15B 18/00 91/465 |
| 4,616,674 | A | * | 10/1986 | Bardoll ................. F15B 13/042 91/465 |
| 8,596,575 | B2 | * | 12/2013 | Ito ........................... F15B 18/00 244/99.2 |

\* cited by examiner

When a valve core structure moves in a first direction, a first circulation cavity is controlled to collect and store compressed gas discharged from a first cylinder cavity of a cylinder apparatus and then passing through a solenoid valve apparatus, and compressed gas stored in a second circulation cavity and the compressed gas supplied from the solenoid valve apparatus are controlled to jointly charge a second cylinder cavity of the cylinder apparatus ⸺ S1301

FIG. 13

GAS CIRCULATION APPARATUS, GAS CIRCULATION METHOD, PNEUMATIC APPARATUS, AND SEMICONDUCTOR DEVICE

CROSS-REFERENCE TO RELATED APPLICATIONS

This is a continuation of International Patent Application No. PCT/CN2021/112840 filed on Aug. 16, 2021, which claims priority to Chinese Patent Application No. 202110910384.0 filed on Aug. 9, 2021. The disclosures of these applications are incorporated by reference herein in their entirety.

BACKGROUND

Typical semiconductor equipment generally includes many pneumatic components, which can be used for movement of a gate valve, a moving rod, or a drive disc of a semiconductor device machine. Pneumatic components have the advantages of being stable and durable, and can meet the needs of long-term and multi-frequency operation for semiconductor device machines, and thus the pneumatic components can be widely used in various machines.

SUMMARY

Embodiments of this application relate to, but are not limited to, a gas circulation apparatus, a gas circulation method, a pneumatic apparatus, and a semiconductor device.

According to a first aspect of the embodiments of this application, there is provided a gas circulation apparatus. The gas circulation apparatus is applied to a pneumatic apparatus including a solenoid valve apparatus and a cylinder apparatus, and the gas circulation apparatus is connected in series between the solenoid valve apparatus and the cylinder apparatus. The gas circulation apparatus includes a valve core structure, a first circulation cavity, and a second circulation cavity.

The valve core structure is configured to move in a first direction, so that a compressed gas discharged from a first cylinder cavity of the cylinder apparatus and passing through the solenoid valve apparatus is collected and stored by the first circulation cavity, and a second cylinder cavity of the cylinder apparatus is supplied with a compressed gas stored in the second circulation cavity together with a compressed gas supplied from the solenoid valve apparatus.

According to a second aspect of the embodiments of this application, there is provided a gas circulation method, applied to a gas circulation apparatus, which is connected in series between a solenoid valve apparatus and a cylinder apparatus, and includes a valve core structure, a first circulation cavity, and a second circulation cavity. The method includes the following operations.

When the valve core structure moves in a first direction, the first circulation cavity is controlled to collect and store a compressed gas discharged from a first cylinder cavity of the cylinder apparatus and passing through the solenoid valve apparatus, and a compressed gas stored in the second circulation cavity and a compressed gas supplied from the solenoid valve apparatus are controlled to jointly supply a second cylinder cavity of the cylinder apparatus.

According to a third aspect of the embodiments of this application, there is provided a pneumatic apparatus. The pneumatic apparatus includes a cylinder apparatus, a solenoid valve apparatus, and the gas circulation apparatus described in the first aspect.

According to a fourth aspect of the embodiments of this application, there is provided a semiconductor device. The semiconductor device includes the pneumatic apparatus described in the third aspect.

BRIEF DESCRIPTION OF THE DRAWINGS

FIG. 13 is a schematic flowchart of a gas circulation method according to embodiments of this application.

DETAILED DESCRIPTION

The technical solutions in the embodiments of this application are clearly and fully described below with reference to the accompanying drawings in the embodiments of this application. It can be understood that the specific embodiments described here are only used for explaining the related application, but are not intended to limit this application. Moreover, it needs to also be noted that, for ease of description, the accompanying drawings illustrate only the parts related to the relevant application.

Unless otherwise defined, all technical and scientific terms used herein have meanings same as those commonly understood by those skilled in the art to which this application pertains. The terms used herein are intended for describing the embodiments of this application only and are not intended to limit this application.

In the following description, there is involved "some embodiments" which describe a subset of all possible embodiments. However, it can be understood that "some embodiments" may be a same subset or different subsets of all possible embodiments, and may be combined with each other without conflict.

It needs to be pointed out that the term "first/second/third" involved in the embodiments of this application only distinguishes similar objects, and does not represent a specific order for objects. Understandably, "first/second/third" can be interchanged in a specific order or sequence when permitted, so that the embodiments of this application described herein can be implemented in a sequence other than those illustrated or described herein.

At present, the application of pneumatic components in a wide range requires the provision of a large amount of stable compressed air. A pneumatic component drives a connecting rod to move by charging a cylinder with compressed air, the connecting rod is then reset by means of a spring, gravity, or compressed air, and the gas charging the cylinder is discharged to the outside of the valve body through a gas discharge hole or a pressure relief valve. However, due to frequent operation of the pneumatic component, there may be many gas valves performing gas charging and discharging. Consequently, a large amount of compressed air is discharged and consumed, resulting in a waste of compressed air.

Figure 1:
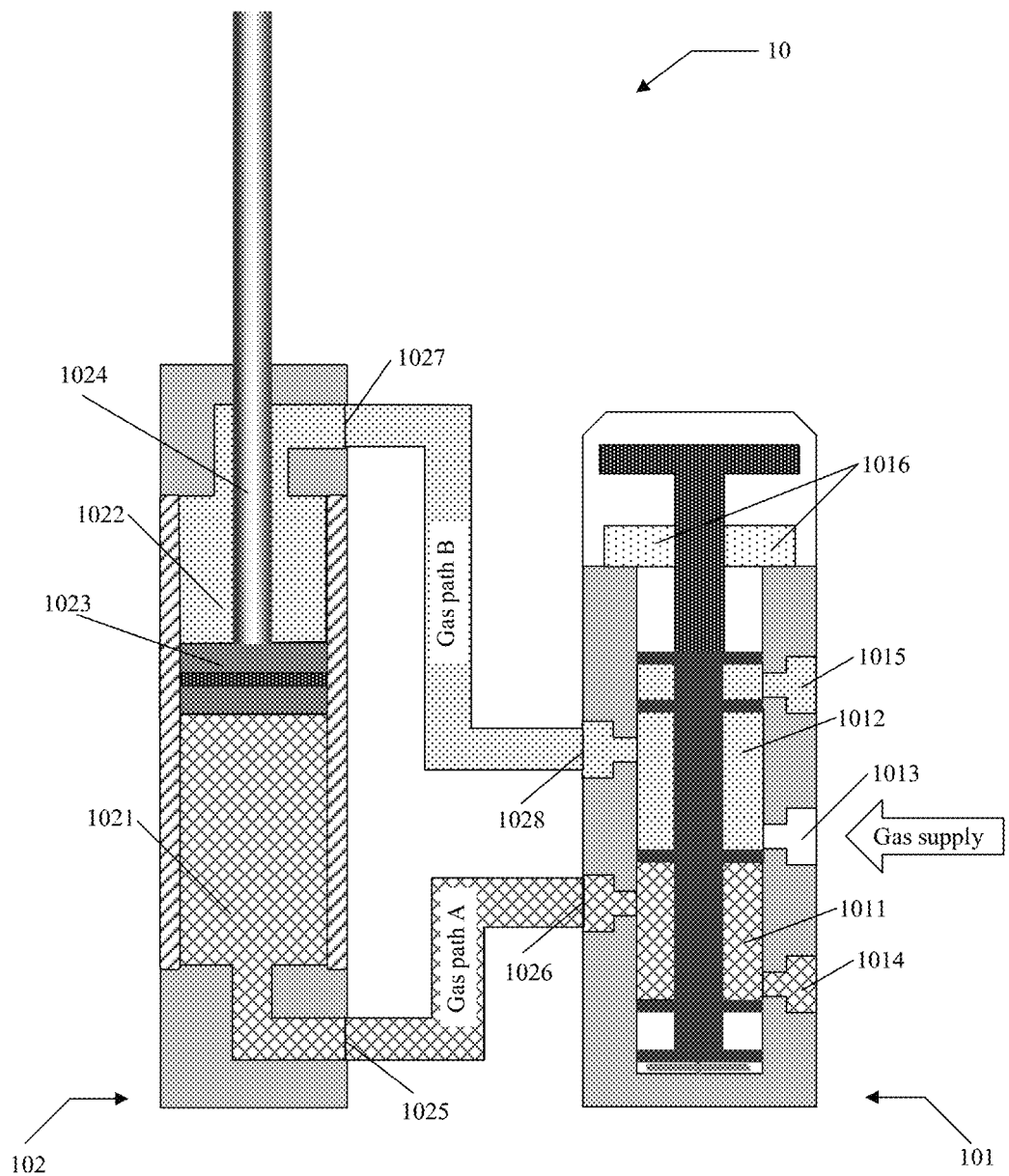
FIG. 1 is a schematic structural diagram of hardware of a pneumatic apparatus according to embodiments of this application.

In an embodiment of the present disclosure, with reference to FIG. 1, a schematic structural diagram of hardware of a pneumatic apparatus 10 according to embodiments of this application is shown. As shown in FIG. 1, the pneumatic apparatus 10 may be formed of a double-acting cylinder 102 and a gas solenoid valve 101, and may also include a gas path A and a gas path B connected between the double-acting cylinder 102 and the gas solenoid valve 101.

Figure 2:
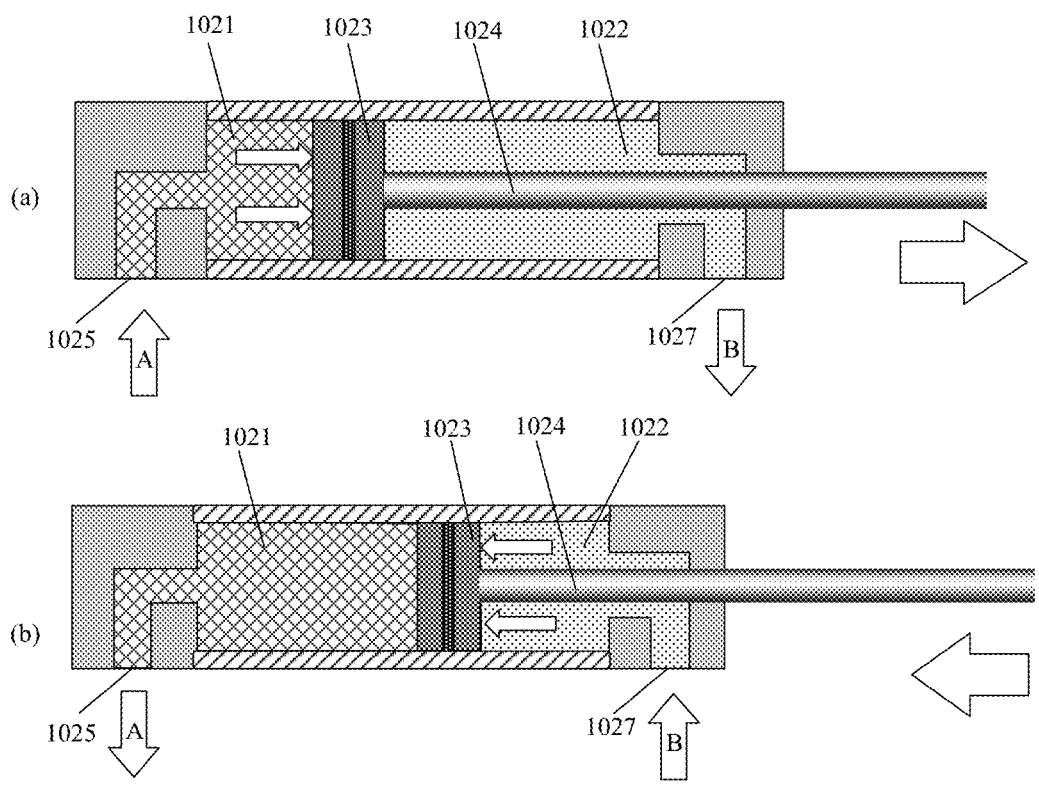
FIG. 2 is a schematic diagram illustrating a working principle of a double-acting cylinder according to embodiments of this application.

With reference to FIG. 2, a schematic diagram illustrating a working principle of a double-acting cylinder according to embodiments of this application is shown. FIG. 2 in (a) shows a schematic diagram illustrating a working principle when a piston rod 1024 is pulled out, and FIG. 2 in (b) shows a schematic diagram illustrating a working principle when the piston rod 1024 is retracted. As shown in FIG. 2, the double-acting cylinder may include a first cavity 1021, a second cavity 1022, a piston 1023, a piston rod 1024, a first gas port 1025 of the gas path A, and a first gas port 1027 of the gas path B. Gas may be supplied to different cavities through different gas ports of gas paths, so that the piston and the piston rod can move in different directions. In addition, such a double-acting cylinder is widely used in a cavity gate valve of a semiconductor device, and is characterized by frequent movements and high stability requirements.

Figure 3:
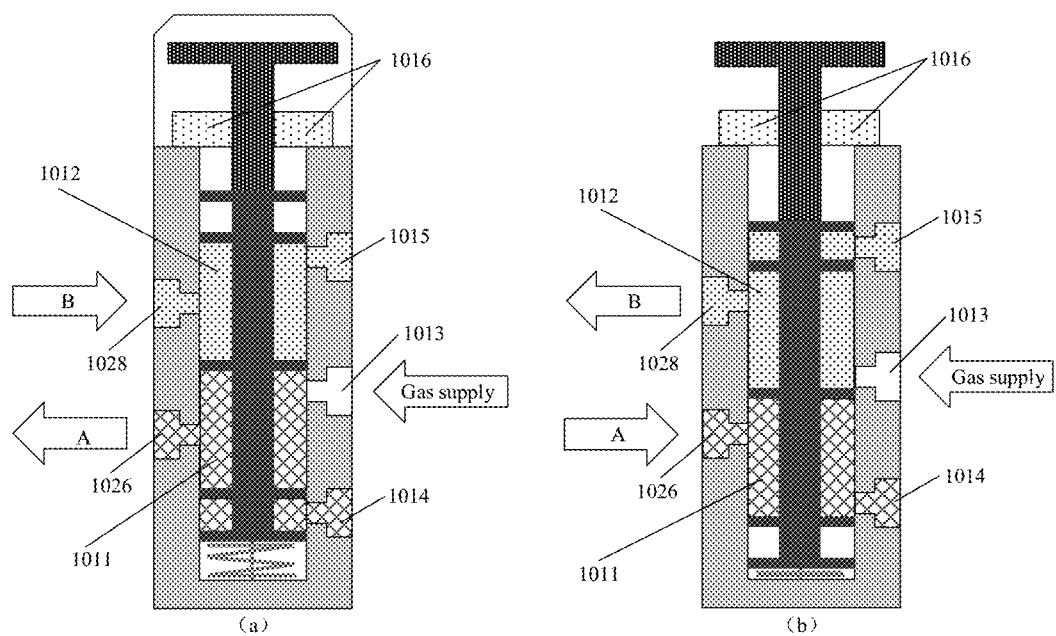
FIG. 3 is a schematic diagram illustrating a working principle of a gas solenoid valve according to embodiments of this application.

With reference to FIG. 3, a schematic diagram illustrating a working principle of a gas solenoid valve according to embodiments of this application is shown. FIG. 3 in (a) shows a schematic diagram illustrating a working principle of a gas solenoid valve when gas is supplied to a third cavity of the gas solenoid valve, and FIG. 3 in (b) shows a schematic diagram illustrating a working principle of the gas solenoid valve when gas is supplied to a fourth cavity of the gas solenoid valve. As shown in FIG. 3, the gas solenoid valve may include a gas supply port 1013, a third cavity 1011, a fourth cavity 1012, a first gas discharge hole 1014, a second gas discharge hole 1015, a sealing structure 1016, a second gas port 1026 of the gas path A, and a second gas port 1028 of the gas path B. The cavity is sealed through the sealing structure to avoid gas leakage, gas is supplied to different cavities through the gas supply port, and then gas is supplied to different cavities of a double-acting cylinder through different gas ports of the gas paths, so that a piston and a piston rod of the double-acting cylinder can move in different directions.

When controlling a double-acting cylinder, the double-acting cylinder may be controlled by the pneumatic solenoid valve shown in FIG. 3. The double-acting cylinder is connected to the gas solenoid valve are by a gas pipe to form a pneumatic circuit. The gas charging/discharging of the double-acting cylinder may be controlled by opening/closing of a valve core of the gas solenoid valve, thereby implementing reciprocating motion of the piston. Moreover, frequent operation of the double-acting cylinder needs to consume a large amount of compressed air.

It can be understood that, with reference to (a) in FIG. 2 and (a) in FIG. 3, when the piston rod 1024 is pulled out, compressed air needs to be supplied to the third cavity 1011 of the gas solenoid valve 101 through the gas supply port 1013, and compressed air passes through the second gas port 1026 of the gas path A and then the gas path A to enter the first cavity 1021 of the double-acting cylinder 102 from the first gas port 1025 of the gas path A, to provide pressure to the piston 1023, thereby pushing the piston 1023 and the piston rod 1024 to move towards the direction of the second cavity 1022. In this case, compressed air in the second cavity 1022 will be forced out, and the compressed air forced out may pass through the first gas port 1027 of gas path B and then the gas path B to enter the fourth cavity 1012 of the gas solenoid valve from the second gas hole 1028 of the gas path B, and then is discharged from the second gas discharge hole 1015.

It can also be understood that, with reference to (b) in FIG. 2 and (b) in FIG. 3, when the piston rod 1024 is retracted, compressed air needs to be supplied to the fourth cavity 1012 of the gas solenoid valve through the gas supply port, and compressed air passes through the second gas port 1028 of gas path B and then the gas path B to enter the second cavity 1022 of the double-acting cylinder 102 through from the first gas port 1027 of gas path B, to provide pressure for the piston, thereby pushing the piston and the piston rod to move towards the direction of the first cavity 1021. In this case, compressed air in the first cavity will be forced out, and the compressed air forced out may pass through the first gas port 1025 of gas path A and then the gas path A to enter the third cavity 1011 of the gas solenoid valve from the second gas port 1026 of gas path A, and then is discharged from the first gas discharge hole 1014. The first gas port 1025 of gas path A and the first gas port 1027 of gas path B are gas discharge holes or pressure relief valve ports of the double-acting cylinder 102.

In the pneumatic apparatus above described, no matter which pipeline supplies gas, excess compressed air needs to be discharged through the first gas discharge hole or the second gas discharge hole. In the embodiment of this application, when processing gas discharge, a silencer device may be mounted at the gas discharge hole to reduce noise, and compressed air may be discharged to the atmosphere through the gas discharge hole of the gas solenoid valve. However, although doing this can reduce noise and achieve flexible control of the cylinder, since a large amount of compressed air needs to be consumed in view of frequent operation of the double-acting cylinder, there is still the problem of resource waste caused by a large amount of compressed air being discharged.

On this basis, in order to save compressed air, the following improvements may be implemented for the pneumatic apparatus provided in the embodiments of this application.

Figure 4:
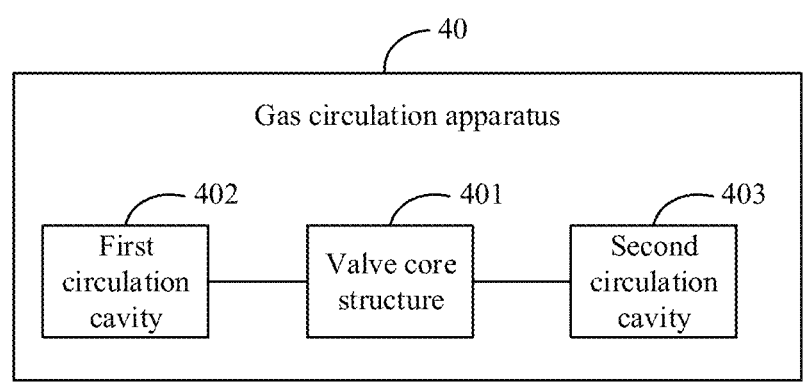
FIG. 4 is a schematic structural composition diagram of a gas circulation apparatus according to embodiments of this application.

In another embodiment of this application, with reference to FIG. 4, a schematic structural diagram of the composition of a gas circulation apparatus 40 according to embodiments of this application is shown. As shown in FIG. 4, the gas circulation apparatus 40 may be applied to a pneumatic apparatus including a solenoid valve apparatus and a cylinder apparatus. The gas circulation apparatus 40 is connected in series between the solenoid valve apparatus and the cylinder apparatus. As shown in FIG. 4, the gas circulation apparatus 40 may include a valve core structure 401, a first circulation cavity 402, and a second circulation cavity 403.

The valve core structure 401 is configured to move in a first direction, so that compressed gas discharged from a first cylinder cavity of the cylinder apparatus and passing through the solenoid valve apparatus is collected and stored by the first circulation cavity 402, and a second cylinder cavity of the cylinder apparatus is charged with compressed gas stored in a second circulation cavity 403 together with the compressed gas supplied from the solenoid valve apparatus.

It needs to be noted that the gas circulation apparatus 40 provided by the embodiments of this application is applied to a pneumatic apparatus. For example, the pneumatic apparatus may be an etch machine, or the like. For the structures of a solenoid valve apparatus (such as a gas solenoid valve) and a cylinder apparatus (such as a double-acting cylinder) included in the pneumatic apparatus, reference may be made to FIG. 1, FIG. 2 and FIG. 3. For the pneumatic apparatus shown in FIG. 1, the gas circulation apparatus 40 provided in the embodiments of this application may be directly connected between its gas solenoid valve and its double-acting cylinder, without damaging the original structure of the pneumatic apparatus and making any improvements to the gas solenoid valve and the double-acting cylinder.

Figure 5:
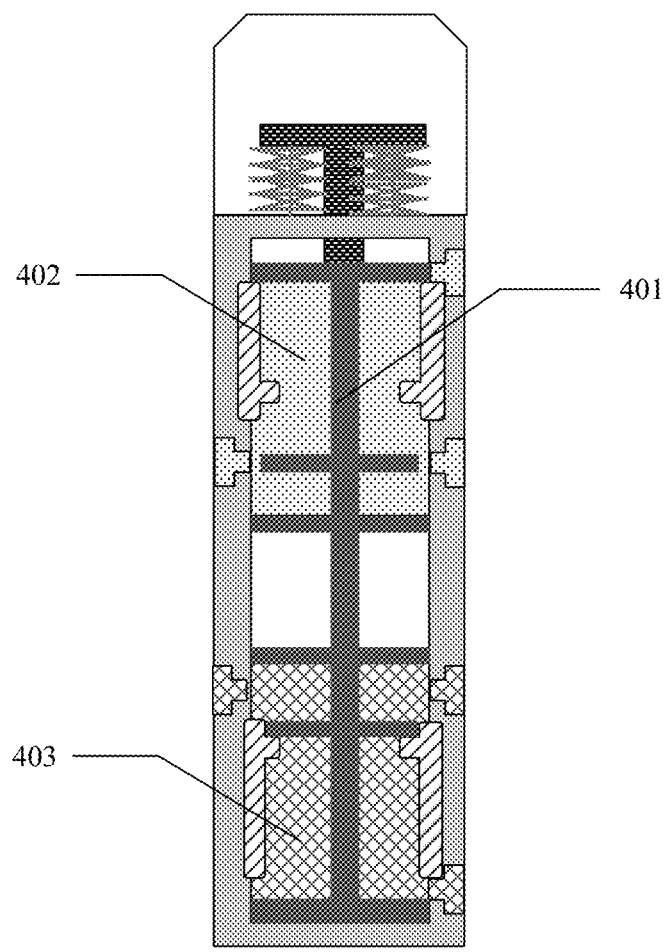
FIG. 5 is a schematic structural diagram of hardware of a gas circulation apparatus according to embodiments of this application.

On this basis, with reference to FIG. 5, a schematic structural diagram of hardware of a gas circulation apparatus 40 according to embodiments of this application is shown. In order to facilitate understanding the working principle of the gas circulation apparatus 40, based on the specific application of the gas circulation apparatus 40 in a pneumatic apparatus, reference is made to FIG. 6, which shows a schematic structural diagram of hardware of another pneumatic apparatus 60 according to embodiments of this application.

Figure 6:
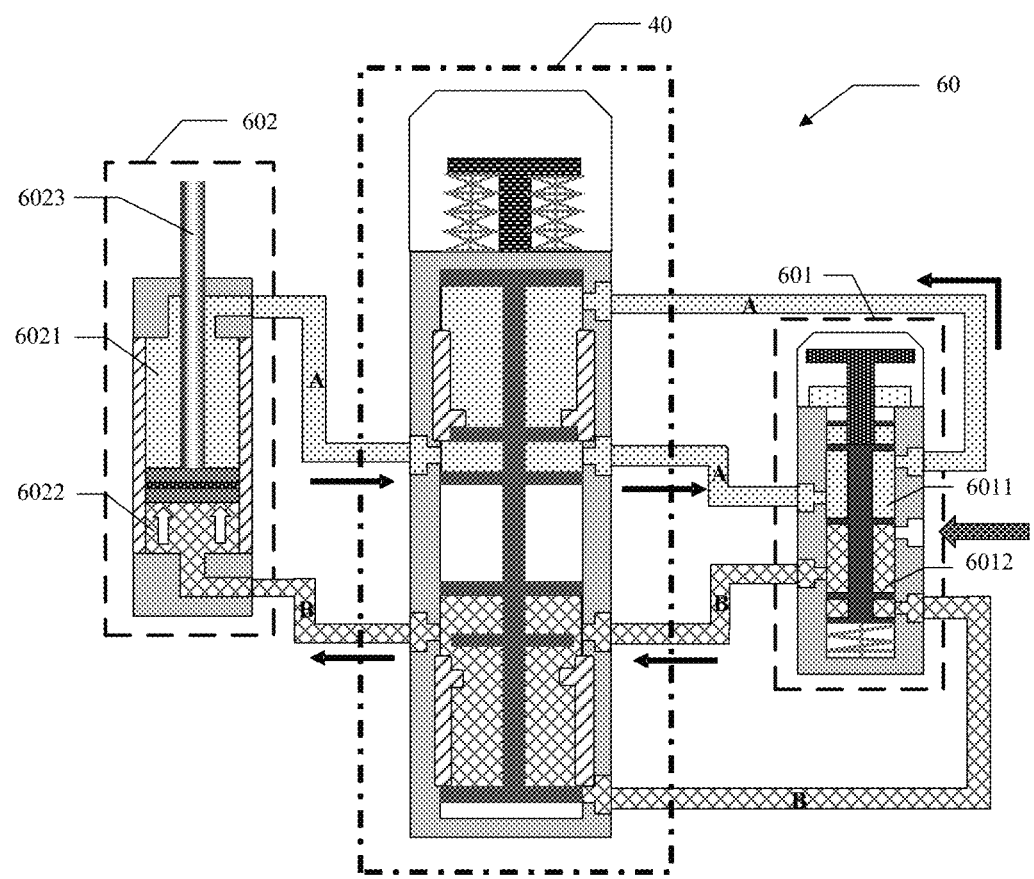
FIG. 6 is a schematic structural diagram of hardware of another pneumatic apparatus according to embodiments of this application.

As shown in FIG. 6, the pneumatic apparatus 60 includes the gas circulation apparatus 40 described in the embodiments of this application, and may also include a solenoid valve apparatus 601 and a cylinder apparatus 602. The solenoid valve apparatus 601 is preferably a gas solenoid valve (a gas solenoid valve as shown in FIG. 3), and the solenoid valve apparatus may include a first solenoid valve cavity 6011 and a second solenoid valve cavity 6012. The cylinder apparatus 602 is preferably a double-acting cylinder (the double-acting cylinder as shown in FIG. 2), and the cylinder apparatus 602 may include a first cylinder cavity 6021, a second cylinder cavity 6022, and a piston rod 6023.

Figure 7:
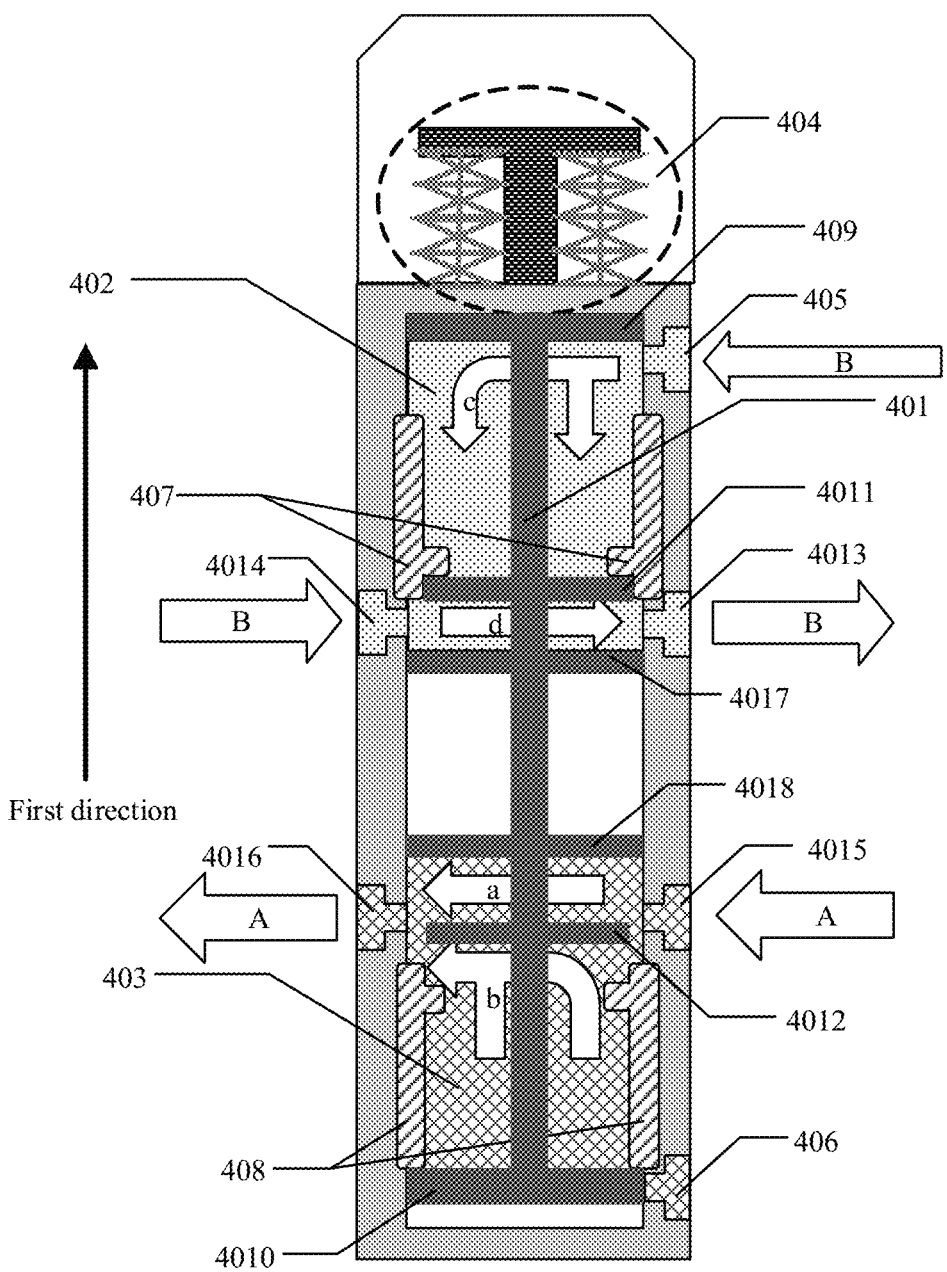
FIG. 7 is a schematic diagram illustrating a working principle of a gas circulation apparatus according to embodiments of this application.

With reference to FIG. 7, a schematic diagram illustrating a working principle of a gas circulation apparatus according to embodiments of this application is shown. According to the working principle in FIG. 7, when a valve core structure of the gas circulation apparatus 40 moves in a first direction, the flow direction of compressed gas in the pneumatic apparatus 60 in this case is shown by the black arrow in FIG. 6.

In this case, the piston rod 6023 of the cylinder apparatus 602 is pulled out, and compressed gas discharged from the first cylinder cavity 6021 of the cylinder apparatus 602 passes through the gas circulation apparatus 40 and the solenoid valve apparatus 601 respectively via a gas path A, to finally enter the first circulation cavity 402 for storage. Meanwhile, the second cylinder cavity 6022 of the cylinder apparatus 602 is charged with compressed gas originally stored in the second circulation cavity 403 together with the compressed gas supplied from the solenoid valve apparatus 601.

It needs also to be noted that the gas circulation apparatus provided in the embodiments of this application may not only be directed to an apparatus driven by compressed air, but also be directed to an apparatus driven by other gases, which is not specifically limited in the embodiments of this application.

In some embodiments, the valve core structure 401 is further configured to move in a second direction, so that compressed gas discharged from the second cylinder cavity 6022 of the cylinder apparatus 602 and then passing through the solenoid valve apparatus 601 is collected and stored by the second circulation cavity 403, and the first cylinder cavity 6021 of the cylinder apparatus 602 is charged with the compressed gas stored in the first circulation cavity 402 together with the compressed gas supplied from the solenoid valve apparatus 601.

Figure 8:
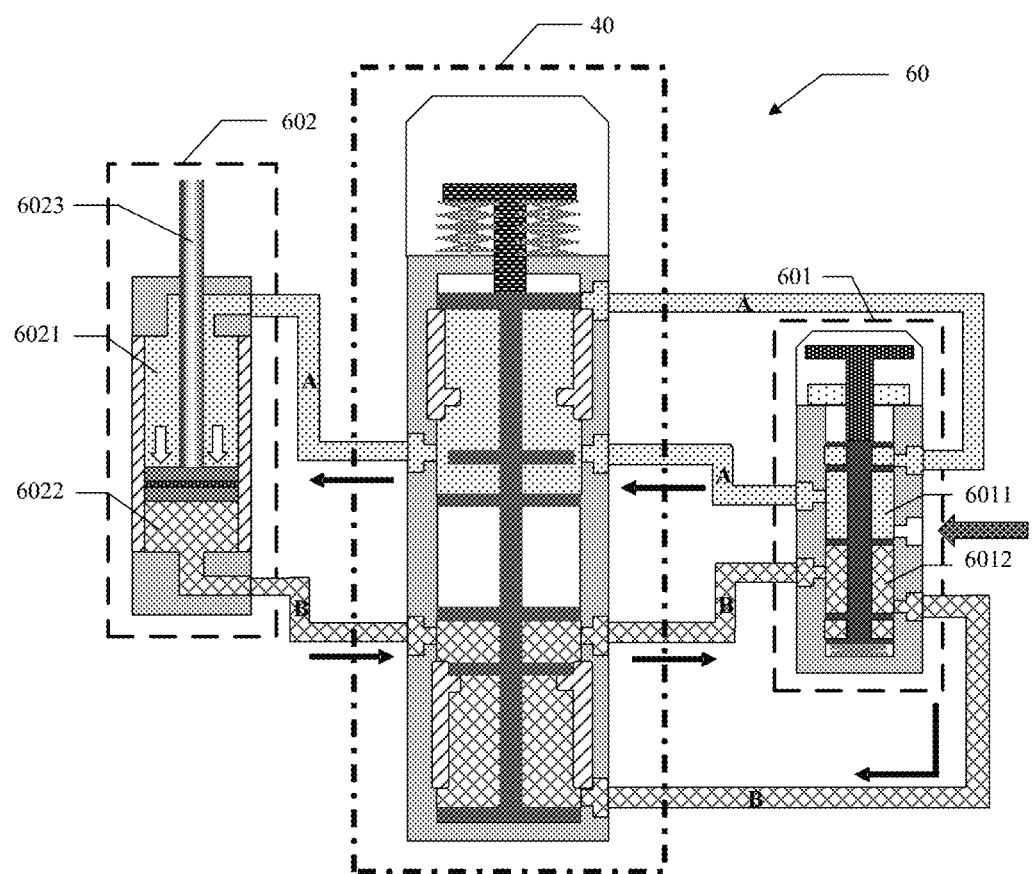
FIG. 8 is a schematic structural diagram of hardware of a further pneumatic apparatus according to embodiments of this application.

It should be noted that, in the embodiments of this application, the first circulation cavity 402 and the second circulation cavity 403 have both the functions of storing compressed gas and supplying gas to the cavities of the cylinder apparatus 602. With reference to FIG. 8, a schematic structural diagram of hardware of a further pneumatic apparatus 60 according to embodiments of this application when the valve core structure 401 moves in the second direction is shown. Compared with FIG. 6, the both have the same specific hardware structure except for the flow direction of compressed gas.

Figure 9:
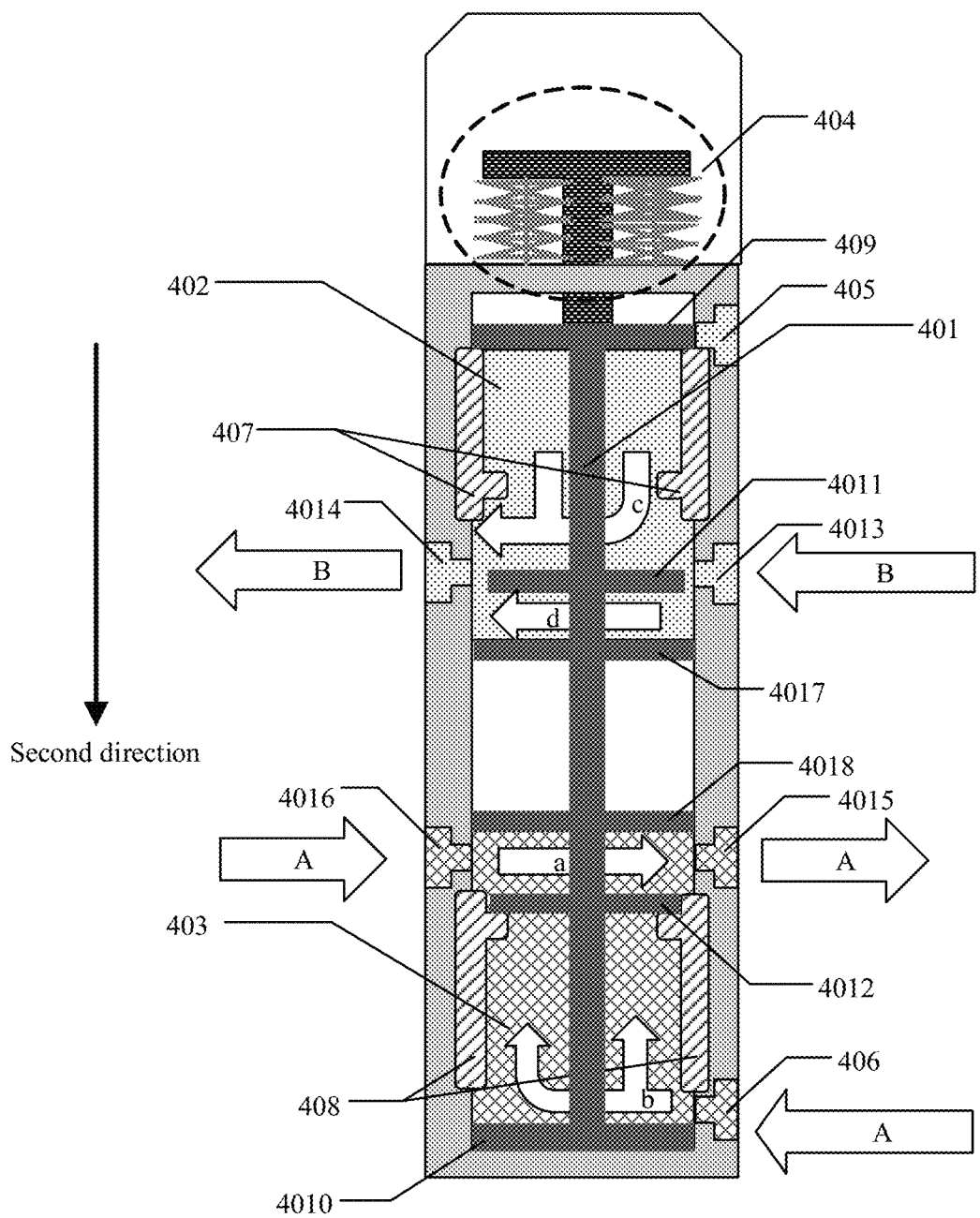
FIG. 9 is a schematic diagram illustrating a working principle of another gas circulation apparatus according to embodiments of this application.

With reference to FIG. 9, a schematic diagram illustrating a working principle of another gas circulation apparatus according to embodiments of this application when the valve core structure 401 moves in the second direction is shown. According to the working principle of FIG. 9, when the valve core structure 401 of the gas circulation apparatus 40 moves in the second direction, the flow direction of compressed gas in the pneumatic apparatus 60 in this case is shown by the black arrow in FIG. 8.

In this case, the piston rod 6023 of the cylinder apparatus 602 is retracted, and compressed gas discharged from the second cylinder cavity 6022 of the cylinder apparatus 602 passes through the gas circulation apparatus 40 and the solenoid valve apparatus 601 respectively via a gas path B, to finally enter the second circulation cavity 403 for storage. Meanwhile, the first cylinder cavity 6021 of the cylinder apparatus 602 is charged with compressed gas originally stored in the first circulation cavity 402 together with the compressed gas supplied from the solenoid valve apparatus 601.

In view of the above, the gas circulation apparatus provided by the embodiments of this application is mounted between the solenoid valve apparatus 601 and the cylinder apparatus 602 to recycle gas discharged from the cylinder apparatus 602, and the gas discharge hole of the solenoid valve apparatus is connected to the gas circulation apparatus 40, thereby avoiding waste caused by direct gas discharge into the air, which effectively saves energy, and saves costs. After the gas circulation apparatus 40 is applied to the cylinder apparatus 602 (such as a double-acting cylinder), compressed air discharged from the gas discharge hole of the cylinder apparatus 602 is reused in a driving circuit for recycling. In addition, the gas circulation apparatus 40 can be popularized to more gas driving circuits, thereby producing great saving after wide application.

In some embodiments, with reference to FIG. 7 and FIG. 9, the gas circulation apparatus 40 may further include a connecting rod 404 connected to the valve core structure 401.

The connecting rod 404 is configured to drive the valve core structure 401 to move in the first direction responsive to receiving a first driving instruction, so that the gas circulation apparatus 40 is in a first working state, or the connecting rod 404 is further configured to drive the valve core structure 401 to move in the second direction responsive to receiving a second driving instruction, so that the gas circulation apparatus 40 is in a second working state.

It needs to be noted that, in the gas circulation apparatus 40, the connecting rod 404 may be a spring driving structure, or may be any other structure known in the art that can drive the valve core structure 401 to move, which is not specifically limited in the embodiments of this application.

Regarding that the connecting rod 404 drives the valve core structure 401 to move in the first direction responsive to receiving a first driving instruction, so that the gas circulation apparatus 40 is in the first working state, the first working state is a working state in which the first circulation cavity 402 stores compressed gas discharged from the first cylinder cavity 6021 of the cylinder apparatus 602, and the second circulation cavity 403 supplies gas to the second cylinder cavity 6022 of the cylinder apparatus 602 by using compressed gas stored in the second circulation cavity 403 itself together with compressed gas supplied from the solenoid valve apparatus 601.

Regarding that the connecting rod 404 drives the valve core structure 401 to move in the second direction responsive to receiving a second driving instruction, so that the gas circulation apparatus 40 is in the second working state, the second working state is a working state in which the second circulation cavity 403 stores compressed gas discharged from the second cylinder cavity 6022 of the cylinder apparatus 602, and the first circulation cavity 402 supplies gas to the first cylinder cavity 6021 of the cylinder apparatus 602 by using compressed gas stored in the first circulation cavity 402 itself together with compressed gas supplied from the solenoid valve apparatus 601.

In this way, by receiving different driving instructions, the connecting rod 404 drives the valve core structure 401 in different directions, so that the gas circulation apparatus 40 is in different working states. In addition, in the embodiments of this application, when the gas circulation apparatus 40 is applied to the pneumatic apparatus 60, the gas circulation apparatus 40 and the solenoid valve apparatus 601 both can receive a same control instruction (for example, can receive a same Input/Output (IO) signal), to supply gas to the cylinder apparatus 602 together and work together to complete recovery and storage of compressed gas.

In some embodiments, with reference to FIG. 7 and FIG. 9, the gas circulation apparatus 40 may further include a first gas recovery hole 405 and a second gas recovery hole 406. The first gas recovery hole 405 is arranged on a side wall of the first circulation cavity 402, and the second gas recovery hole 406 is arranged on a side wall of the second circulation cavity 403.

The first gas recovery hole 405 is configured to guide the compressed gas discharged from the first cylinder cavity 6021 into the first circulation cavity 402 through the solenoid valve apparatus 601 when the gas circulation apparatus 40 is in the first working state.

The second gas recovery hole 406 is configured to guide the compressed gas discharged from the second cylinder cavity 6022 into the second circulation cavity 403 through the solenoid valve apparatus 601 when the gas circulation apparatus 40 is in the second working state.

It needs to be noted that FIG. 6 and FIG. 7 show the working principle of the gas circulation apparatus 40 when the gas circulation apparatus 40 is in the first working state. Specifically, in the first working state, the compressed gas discharged from the first cylinder cavity 6021 passes through the solenoid valve apparatus 601 (may specifically pass through the first solenoid valve cavity 6011) via the gas path B, and is then guided into the first circulation cavity 402 from the first gas recovery hole 405.

It needs to also be noted that FIG. 8 and FIG. 9 show the working principle of the gas circulation apparatus 40 when the gas circulation apparatus 40 is in the second working state. Specifically, in the second working state, the compressed gas discharged from the second cylinder cavity 6022 passes through the solenoid valve apparatus 601 (may specifically pass through the second solenoid valve cavity 6012) via the gas path A, and is then guided into the second circulation cavity 403 from the second gas recovery hole 406.

In some specific embodiments, the connecting rod 404 is specifically configured to drive the valve core structure 401 to move in the first direction, and the valve core structure is stopped from moving when the valve core structure 401 moves to a position in which the first gas recovery hole 405 is opened and the second gas recovery hole 406 is closed, so that the gas circulation apparatus 40 is in the first working state.

It needs to be noted that, taking FIG. 6 and FIG. 7 as examples, driving the valve core structure 401 by the connecting rod 404 to move in the first direction so that the gas circulation apparatus 40 is in the first working state can be specifically implemented in the following manner. When the valve core structure 401 moves in the first direction so that the first gas recovery hole 405 is opened and the second gas recovery hole 406 is closed, the compressed gas may enter the first circulation cavity 402 through the first gas recovery hole 405 due to the first gas recovery hole 405 being opened, to achieve gas recovery, and the compressed gas will not enter the second circulation cavity 403 through the second gas recovery hole 406 due to the second gas recovery hole 406 being closed.

In some other specific embodiments, the connecting rod 404 is specifically configured to drive the valve core structure 401 to move in the second direction, and the valve core structure is stopped from moving when the valve core structure 401 moves to a position in which the first gas recovery hole 405 is closed and the second gas recovery hole 406 is opened, so that the gas circulation apparatus 40 is in the second working state.

It needs to also be noted that, taking FIG. 8 and FIG. 9 as examples, driving the valve core structure 401 by the connecting rod 404 to move in the second direction so that the gas circulation apparatus 40 is in the second working state can be specifically implemented in the following manner. When the valve core structure 401 moves in the second direction so that the first gas recovery hole 405 is closed and the second gas recovery hole 406 is opened, the compressed gas will not enter the first circulation cavity 402 through the first gas recovery hole 405 due to the first gas recovery hole 405 being closed, and the compressed gas may enter the second circulation cavity 403 through the second gas recovery hole 406 due to the second gas recovery hole 406 being opened, to achieve gas recovery.

Further, with reference to FIG. 7 and FIG. 9, in some embodiments, the gas circulation apparatus 40 may further include a first sealing structure 407 and a second sealing structure 408. The first sealing structure 407 is arranged on an inner side of the first circulation cavity 402, and the second sealing structure 408 is arranged on an inner side of the second circulation cavity 403.

The valve core structure 401 may include a first piston 409 and a second piston 4010, the first piston 409 is located in the first circulation cavity 402, and the second piston 4010 is located in the second circulation cavity 403.

The valve core structure 401 is further configured to, when moving in the first direction, control the first piston 409 to move to a position in which the first gas recovery hole 405 is opened, and control the second piston 4010 to move to engage with the second sealing structure 408 to close the second gas recovery hole 406.

Or, the valve core structure 401 is further configured to, when moving in the second direction, control the first piston 409 to move to engage with the first sealing structure 407 to close the first gas recovery hole 405, and control the second piston 4010 to move to a position in which the second gas recovery hole 406 is opened.

It needs to be noted that, taking FIG. 7 as an example, when the valve core structure 401 moves in the first direction, the first piston 409 moves in the first direction along with the valve core structure 401 and opens the first gas recovery hole 405. In this case, the compressed gas in the gas path B may enter the first circulation cavity 402 through the first gas recovery hole 405. Moreover, the second piston 4010 also moves in the first direction along with the valve core structure 401 and engages with the second sealing structure 408 to close the second gas recovery hole 406, that is, the second piston 4010 blocks the second gas recovery hole 406. In this case, since the second gas recovery hole 406 is closed, the compressed gas cannot enter the second circulation cavity 403 through the second gas recovery hole 406.

It also needs to be noted that, taking FIG. 9 as an example, when the valve core structure 401 moves in the second direction, the first piston 409 moves in the second direction along with the valve core structure 401 and engages with the first sealing structure 407 to close the first gas recovery hole 405, that is, the first piston 409 blocks the first gas recovery hole 405. In this case, since the first gas recovery hole 405 is closed, the compressed gas cannot enter the first circulation cavity 402 through the first gas recovery hole 405. Moreover, the second piston 4010 also moves in the second direction along with the valve core structure 401 and opens the second gas recovery hole 406. In this case, the compressed gas in the gas path A can enter the second circulation cavity 403 through the second gas recovery hole 406.

Further, with reference to FIG. 7 and FIG. 9, in some embodiments, the valve core structure 401 may further include a third piston 4011 and a fourth piston 4012, the third piston 4011 is located in the first circulation cavity 402, and the fourth piston 4012 is located in the second circulation cavity 403.

The valve core structure 401 is further configured to, when moving in the first direction, control the third piston 4011 to move to engage with the first sealing structure 407 to divide the first circulation cavity 402 into a first gas recovery cavity and a first gas passage, and control the fourth piston 4012 to move so that a second gas recovery cavity and a second gas passage are combined into the second circulation cavity 403.

Or, the valve core structure 401 is further configured to, when moving in the second direction, control the third piston 4011 to move so that the first gas recovery cavity and the first gas passage are combined into the first circulation cavity 402, and control the fourth piston 4012 to move to engage with the second sealing structure 408 to divide the second circulation cavity 403 into the second gas recovery cavity and the second gas passage.

The first gas passage is configured to communicate the first cylinder cavity 6021 with the solenoid valve apparatus 601, and the second gas passage is configured to communicate the second cylinder cavity 6022 with the solenoid valve apparatus 601.

It needs to be noted that, in the embodiments of this application, the valve core structure 401 may further include a third piston 4011 located in the first circulation cavity 402 and a fourth piston 4012 located in the second circulation cavity 403. The third piston 4011 and the fourth piston 4012 move in different directions along with the valve core structure, so that the first circulation cavity 402 and the second circulation cavity 403 are in different states.

Specifically, taking FIG. 7 as an example, when the valve core structure 401 moves in the first direction, the third piston 4011 moves in the first direction along with the valve core structure 401 until the third piston 4011 engages with the first sealing structure 407. In this case, the first circulation cavity 402 is divided into two parts, namely, a first gas recovery cavity and a first gas passage, by the third piston 4011. The first gas recovery cavity is an area where a gas path c in FIG. 7 is located, and the first gas passage is an area where a gas path d in FIG. 7 is located. In this case, the compressed gas discharged from the first cylinder cavity 6021 passes through the gas circulation apparatus 40 from the first gas passage, then enters the solenoid valve apparatus 601, and then enters the first gas recovery cavity through the first gas recovery hole 405. The gas flow after the compressed gas enters the first gas recovery cavity is that as shown by the gas path c.

Further, as shown in FIG. 7, when the valve core structure 401 moves in the first direction, the fourth piston 4012 also moves in the first direction along with the valve core structure 401, and is separated from the second sealing structure 408. In this case, the second gas recovery cavity and the second gas passage will no longer be two independent parts, that is, they communicate with each other to form the second circulation cavity 403 together. At this time, the compressed gas supplied from the solenoid valve apparatus 601 and the compressed gas stored in the second gas recovery cavity will be guided into the second cylinder cavity 6022 of the cylinder apparatus 602 together to supply gas to the second cylinder cavity 6022.

Taking FIG. 9 as an example, when the valve core structure 401 moves in the second direction, the fourth piston 4012 moves in the second direction along with the valve core structure 401 until the fourth piston 4012 engages with the second sealing structure 408. In this case, the second circulation cavity 403 is divided into two parts, namely, a second gas recovery cavity and a second gas passage, by the fourth piston 4012. The second gas recovery cavity is an area where a gas path b in FIG. 9 is located, and the second gas passage is an area where a gas path a in FIG. 9 is located. In this case, the compressed gas discharged from the second cylinder cavity 6022 passes through the gas circulation apparatus 40 from the second gas passage, enters the solenoid valve apparatus 601, and then enters the second gas recovery cavity through the second gas recovery hole 406. The gas flow after the compressed gas enters the second gas recovery cavity is that as shown by the gas path b.

Further, as shown in FIG. 9, when the valve core structure 401 moves in the second direction, the third piston 4011 also moves in the second direction along with the valve core structure 401, and is separated from the first sealing structure 407. In this case, the first gas recovery cavity and the first gas passage will no longer be two independent parts, and as shown in FIG. 8 and FIG. 9, the two parts communicate with each other to form the first circulation cavity 402 together. In this case, the compressed gas supplied from the solenoid valve apparatus 601 and the compressed gas stored in the first gas recovery cavity will be guided into the first cylinder cavity 6021 of the cylinder apparatus 602 together to supply gas to the first cylinder cavity 6021.

In view of the above, the first gas passage is configured to communicate the first cylinder cavity 6021 with the solenoid valve apparatus 601, so that the compressed gas discharged from the first cylinder cavity 6021 enters the solenoid valve apparatus 601, and the second gas passage is configured to communicate the second cylinder cavity 6022 with the solenoid valve apparatus 601, so that the compressed gas discharged from the second cylinder cavity 6022 enters the solenoid valve apparatus 601.

In some embodiments, with reference to FIG. 7 and FIG. 9, the first gas passage may include a first first-gas-hole 4013 and a first second-gas-hole 4014, the first first-gas-hole 4013 is arranged on a side wall of the first circulation cavity 402 close to the solenoid valve apparatus 601 side, and the first second-gas-hole 4014 is arranged on a side wall of the first circulation cavity 402 close to the first cylinder cavity 6021 side.

The second gas passage may include a second first-gas-hole 4015 and a second second-gas-hole 4016, the second first-gas-hole 4015 is arranged on a side wall of the second circulation cavity 403 close to the solenoid valve apparatus 601 side, and the second second-gas-hole 4016 is arranged on a side wall of the second circulation cavity 403 close to the second cylinder cavity 6022 side.

It needs to be noted that, taking FIG. 7 as an example, the first gas passage may further include a first first-gas-hole 4013 and a first second-gas-hole 4014, which each are arranged on the side wall of the first circulation cavity 402. The first first-gas-hole 4013 and the solenoid valve apparatus 601 can be connected by a connecting pipeline therebetween to deliver compressed gas. Specifically, the first first-gas-hole 4013 can be connected to the first solenoid valve cavity 6011 of the solenoid valve apparatus 601. The first second-gas-hole 4014 and the first cylinder cavity 6021 can be connected with each other by a connecting pipeline therebetween to deliver compressed gas. In other words, the statement "the first first-gas-hole 4013 is arranged on a side wall of the first circulation cavity 402 close to the solenoid valve apparatus 601 side, and the first second-gas-hole 4014 is arranged on a side wall of the first circulation cavity 402 close to the first cylinder cavity 6021 side" here specifically means that: the first first-gas-hole 4013 is arranged on the right side wall of the first circulation cavity 402 at a position in which the first circulation cavity is connected to the solenoid valve apparatus 601, and the first second-gas-hole 4014 is arranged on the left side wall of the first circulation cavity 402 at a position in which the first circulation cavity is connected to the first cylinder cavity 6021. However, those skilled in the art can understand that as long as the connection and gas delivery can be implemented, the actual positions are not specifically limited.

It needs to also be noted that, taking FIG. 9 as an example, the second gas passage may further include a second first-gas-hole 4015 and a second second-gas-hole 4016, which each are arranged on the side wall of the second circulation cavity 403. By connecting a pipeline between the second first-gas-hole 4015 and the solenoid valve apparatus 601, the second first-gas-hole and the solenoid valve apparatus can be connected to deliver compressed gas. Specifically, the second first-gas-hole 4015 can be connected to the second solenoid valve cavity 6012 of the solenoid valve apparatus 601. By connecting a pipeline between the second second-gas-hole 4016 and the second cylinder cavity 6022, the second second-gas-hole and the second cylinder cavity can be connected to deliver compressed gas. In other words, the statement "the second first-gas-hole 4015 is arranged on the side wall of the second circulation cavity 403 close to the solenoid valve apparatus 601 side, and the second second-gas-hole 4016 is arranged on the side wall of the second circulation cavity 403 close to the second cylinder cavity 6022 side" here specifically means that: the second first-gas-hole 4015 is arranged on the right side wall of the second circulation cavity 403 at a position in which the second circulation cavity is connected to the solenoid valve apparatus 601, and the second second-gas-hole 4016 is arranged on the left side wall of the second circulation cavity 403 at a position in which the second circulation cavity is connected to the second cylinder cavity 6022. However, those skilled in the art can understand that as long as the connection and gas delivery can be implemented, the actual positions are not specifically limited.

In some embodiments, with reference to FIG. 7 and FIG. 9, the valve core structure 401 may further include a fifth piston 4017 and a sixth piston 4018, the fifth piston 4017 is located in the first circulation cavity 402, and the sixth piston 4018 is located in the second circulation cavity 403.

Side walls of the first circulation cavity 402 may include the first piston 409 and the fifth piston 4017.

Side walls of the second circulation cavity 403 may include the second piston 4010 and the sixth piston 4018.

It needs to be noted that, as shown in FIG. 7 or FIG. 9, the valve core structure 401 may further include the fifth piston 4017 located in the first circulation cavity 402 and the sixth piston 4018 located in the second circulation cavity 403. It can be understood that as the valve core structure 401 moves in the first direction or in the second direction, the positions of the first circulation cavity 402 and the second circulation cavity 403 are also changed. The first piston 409, the fifth piston 4017, and a housing of the gas circulation apparatus 40 together form a cavity space of the first circulation cavity 402. That is to say, Side walls of the first circulation cavity 402 may include the first piston 409 and the fifth piston 4017. In the drawings, the first piston 409 serves as an upper wall of the first circulation cavity 402, and the fifth piston 4017 serves as a lower wall of the first circulation cavity 402.

The second piston 4010, the sixth piston 4018, and the housing of the gas circulation apparatus 40 together form a cavity space of the second circulation cavity 403. That is to say, side walls of the second circulation cavity 403 may include the second piston 4010 and the sixth piston 4018. In the drawings, the sixth piston 4018 serves as an upper wall of the second circulation cavity 403, and the second piston 406 serves as a lower wall of the second circulation cavity 403.

In this case, an empty cavity will be formed between the fifth piston 4017 and the sixth piston 4018 (that is, between the first gas circulation cavity 402 and the second circulation cavity 403), as shown in the blank area between the fifth piston 4017 and the sixth piston 4018 in FIG. 7 or FIG. 9.

In some embodiments, there may be no empty cavity formed between the first gas circulation cavity 402 and the second circulation cavity 403, and the valve core structure 401 may also include only the fifth piston 4017.

Side walls of the first circulation cavity 402 may include the first piston 409 and the fifth piston 4017.

Side walls of the second circulation cavity 403 may include the second piston 4010 and the fifth piston 4017.

Figure 10:
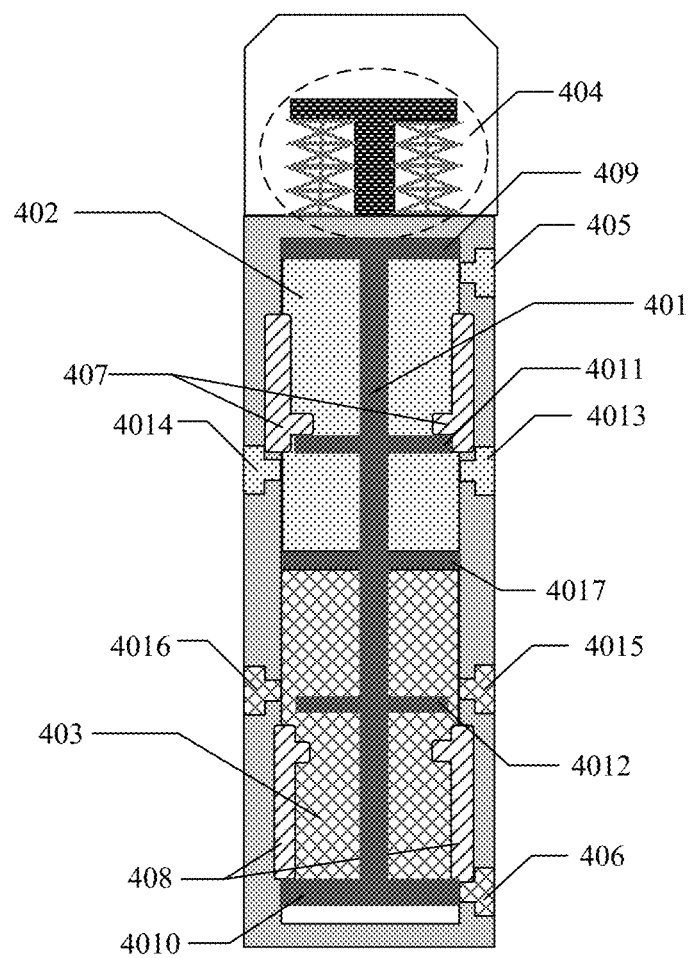
FIG. 10 is a schematic structural diagram of hardware of another gas circulation apparatus according to embodiments of this application.

It needs to be noted that, with reference to FIG. 10, a schematic structural diagram of hardware of another gas circulation apparatus according to embodiments of this application is shown. The gas circulation apparatus as shown in FIG. 10 differs from the above gas circulation apparatus in that the first circulation cavity 402 and the second circulation cavity 403 share the fifth piston 4017 as their side wall, that is, the fifth piston 4017 serves as not only the lower wall of the first circulation cavity 402, but also the upper wall of the second circulation cavity 403.

Further, in the pneumatic apparatus 60, based on different working states of the gas circulation apparatus 40, the cylinder apparatus 602 can be driven to be in different working states. Specifically, in some embodiments, the valve core structure 401 is further configured to: when moving in the first direction, drive the piston rod 6023 of the cylinder apparatus 602 to move in a third direction by the gas circulation apparatus 40; or when moving in the second direction, drive the piston rod 6023 of the cylinder apparatus 602 to move in a fourth direction by the gas circulation apparatus 40.

It needs to be noted that, taking FIG. 6 as an example, in the cylinder apparatus 602, the direction indicated by the white arrow indicates the third direction. When the valve core structure 401 of the gas circulation apparatus 40 moves in the first direction, since gas is supplied to the second cylinder cavity 6022 by the second circulation cavity 403 and the solenoid valve apparatus 601, to provide power to the piston in the cylinder apparatus 602, the piston rod 6023 is pushed to move in the direction of the first cylinder cavity 6021 (that is, in the third direction).

Taking FIG. 8 as an example, in the cylinder apparatus 602, the direction indicated by the white arrow indicates the fourth direction. When the valve core structure 401 of the gas circulation apparatus 40 moves in the second direction, since gas is supplied to the first cylinder cavity 6021 by the first circulation cavity 402 and the solenoid valve apparatus 601 to provide power to the piston in the cylinder apparatus 602, the piston rod 6023 is pushed to move in the direction of the second cylinder cavity 6022 (that is, in the fourth direction).

In this way, as can be seen according to the gas circulation apparatus and the pneumatic apparatus provided in the foregoing embodiments, in the embodiments of this application, recycling of compressed gas can be implemented by only connecting a gas circulation apparatus in series between a solenoid valve apparatus and a cylinder apparatus of an original pneumatic apparatus and directly connecting gas holes/gas ports by quick connectors, without damaging the structure of the original pneumatic apparatus. Moreover, for the solenoid valve apparatus, there is no need to additionally provide a silencer, thereby further saving costs.

Figure 11:
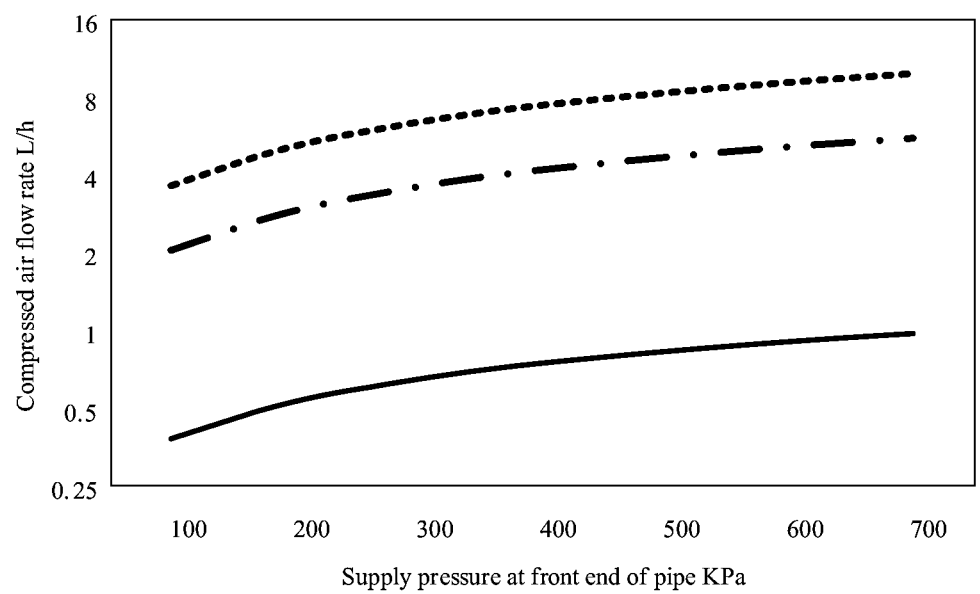
FIG. 11 is a schematic diagram illustrating a relation curve between supply pressure at a front end of a pipe and a compressed air flow rate according to embodiments of this application.

Exemplarily, with reference to FIG. 11, a schematic diagram illustrating a relation curve between supply pressure at a front end of a pipe and a compressed air flow rate according to embodiments of this application is shown. The horizontal coordinate axis (X axis) represents the supply pressure at the front end of the pipe, in kilopascals (KPa), and the vertical coordinate axis (Y axis) represents the compressed air flow rate, in liters per hour (L/h). FIG. 11 shows a change trend of the gas flow per unit time of a gas pipe with the increase of the supply pressure at the front end of the pipe, under different gas valve pipe diameters. The solid line represents the change trend of the gas valve pipe diameter specification of DN10, the dash-dotted line represents the change trend of the gas valve pipe diameter specification of DN15, and the dashed line represents the change trend of the gas valve pipe diameter specification of DN20. For most existing semiconductor devices, compressed air of the entire device is supplied by unified pipes. In order to drive a pneumatic component, a high front-end pressure is required in this case. Taking an etching machine as an example, the front-end pressure is generally not less than 0.3 MPa. In addition, it needs to be noted that FIG. 11 is only an exemplary schematic diagram illustrating the change trend, and the coordinate values shown may be different from actual values. Here, it is only to illustrate the change trend. In the embodiments of this application, corresponding actual values of the supply pressure at the front end of a pipe and the compressed air flow rate for different gas valve pipe diameter specifications need to be specifically determined in combination with the application scenario.

Figure 12:
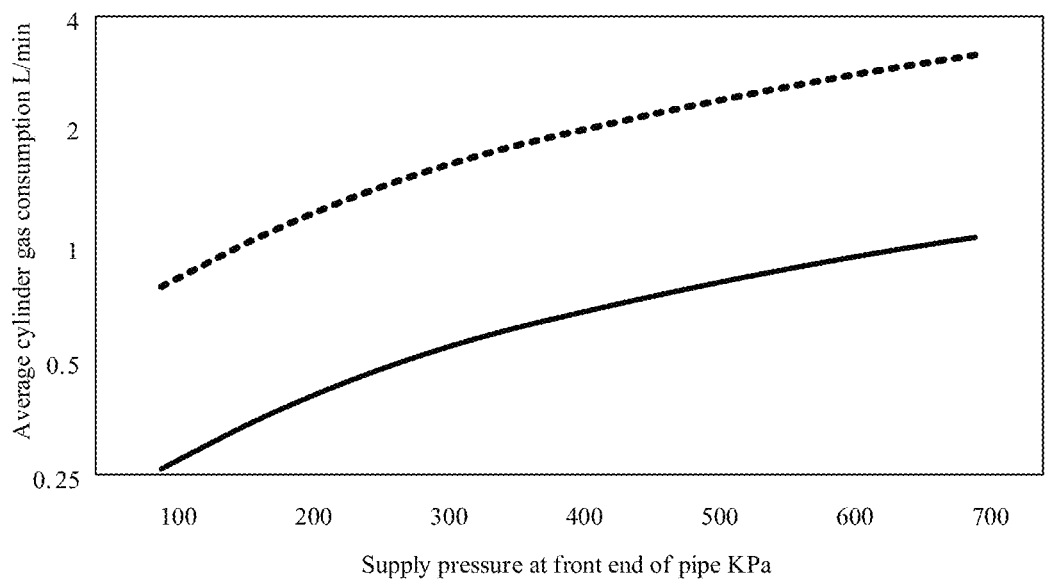
FIG. 12 is a schematic diagram illustrating a relation curve between supply pressure at a front end of a pipe and average cylinder gas consumption according to embodiments of this application.

With reference to FIG. 12, a schematic diagram illustrating a relation curve between pressure at a front end of a pipe and average cylinder gas consumption according to embodiments of this application is shown. The horizontal coordinate axis (X axis) represents the supply pressure at the front end of the pipe, in kilopascals (KPa), and the vertical coordinate axis (Y axis) represents the average cylinder gas consumption, in liters per minute (L/min). In FIG. 12, taking a conventional double-acting cylinder being a 50 mm cylinder as an example, a comparative example of the average cylinder gas consumption of the conventional double-acting cylinder in two cases where the gas circulation apparatus (also referred to as a gas recovery apparatus) provided in the embodiments of this application is not used and is used is shown. The dashed line represents a consumption curve in a case where the gas circulation apparatus provided in the embodiments of this application is not used, and the solid line represents a consumption curve in a case where the gas circulation apparatus provided in the embodiments of this application is used. According to FIG. 12, it can be seen that after the gas circulation apparatus is used, the compressed air consumption is only about ⅓ of the original consumption. As such, the gas consumption can be effectively reduced, energy consumption and costs can be significantly reduced, and the cost-benefit ratio is apparently improved. In addition, it needs to also be noted that FIG. 12 is only an exemplary schematic diagram to show the gas consumption change trend when the gas circulation apparatus is used and when the gas circulation apparatus is not used, and the coordinate values shown in FIG. 12 may be different from actual values. Here, it is only to illustrate the change trend. In the embodiments of this application, for the two cases where the gas circulation apparatus is used and the gas circulation apparatus is not used, the corresponding actual values of the supply pressure at the front end of the pipe and the average cylinder gas consumption also need to be specifically determined in combination with the application scenario.

In other words, the embodiments of this application can be applied to a pneumatic component in a semiconductor device, such as a pneumatic solenoid valve, a pneumatic piston, and a pneumatic swing valve. The gas circulation apparatus is used to recover gas discharged by pressure relief or gas discharge of an ordinary pneumatic component, and then put the gas into the pneumatic system (pneumatic apparatus) for recycling. By recycling compressed air that would otherwise be discharged into the air, the consumption of compressed air is effectively reduced, and the produced cost is reduced.

Further, the gas circulation apparatus provided in the embodiments of this application can be directly mounted in the circuit of an original pneumatic apparatus through a quick connector, and gas discharged by pressure relief of a pneumatic component such as the cylinder can be recovered and recycled, without changing a component and a gas path of the original pneumatic apparatus. That is, compressed air can be recycled by only connecting the gas circulation apparatus between a gas path of the original cylinder and a gas path of a gas solenoid valve and connecting the gas discharge port of the original gas solenoid valve to the gas circulation apparatus, without changing the gas path or device separately. As thus, the consumption of compressed gas and energy is reduced without changing the control circuit of the original pneumatic apparatus, and the costs are saved.

Exemplarily, a one-way valve structure (i.e., a specific example of a gas circulation apparatus) is connected in series on a gas delivery path of a pneumatic component, a pressure relief valve port or gas discharge hole of a cylinder is connected by another pipe, and compressed air discharged by pressure relief is recycled as gas used to drive the cylinder.

In short, the working principle of the gas circulation apparatus is briefly described as follows (taking the movement of the valve core apparatus 401 in the second direction in FIG. 9 as an example). When the gas circulation apparatus 40 receives a second driving instruction, the valve core structure 401 moves downwards, the upper end (the fourth piston 4012) of the second circulation cavity 403 engages with the second sealing structure 408 due to the movement of the valve core structure 401, and the discharged gas in the gas path A returns to the solenoid valve apparatus 601 through the gas path a, is discharged through the gas discharge hole of the solenoid valve apparatus 601, and is then collected in the second circulation cavity 403 of the gas circulation apparatus through the gas path b for use. Moreover, the compressed gas stored in the first circulation cavity 402 can be combined into the gas path d through the gas path c to supply gas for the piston of the cylinder apparatus 602 together. For a case where the valve core apparatus 401 moves in the first direction, the principle is the same, but the gas paths are in opposite conditions. In this way, recovery and utilization of discharged gas can be implemented by the gas circulation apparatus 40.

According to actual measurement results, it can be seen that after mounting the gas circulation apparatus, the original circuit of a pneumatic component is not affected in any way, that is, there is no need to change the hardware configurations, and the operation of the pneumatic component will not cause delay and procrastination. After applying the gas circulation apparatus, the compressed air consumption of pneumatic components is significantly reduced. For example, in one application scenario, the gas consumption of a single component can be reduced to ⅓ of the original consumption, thereby effectively reducing the consumption of compressed air. The gas circulation apparatus can be applied to all pneumatic components including a gas release valve or a gas discharge hole, is easy to mount and simple in structure, and can effectively reduce the consumption of compressed air.

It also needs to be noted that the gas circulation apparatus provided in the embodiments of this application can be applied to a pneumatic valve controlled system having a certain stroke of cylinder movement. Especially for some cylinders that reciprocate periodically, the gas circulation apparatus has significant effect on saving compressed gas. The gas circulation apparatus is especially suitable for a gate valve system of a semiconductor device transfer system, thereby solving the problem of large consumption of compressed air for driving caused by a large number of pneumatic components being used in a semiconductor device.

The embodiments provide a gas circulation apparatus, a gas circulation method, a pneumatic apparatus, and a semiconductor device. The gas circulation apparatus is applied to a pneumatic apparatus including a solenoid valve apparatus and a cylinder apparatus, and is connected in series between the solenoid valve apparatus and the cylinder apparatus. The gas circulation apparatus includes a valve core structure, a first circulation cavity, and a second circulation cavity. The valve core structure is configured to move in a first direction, so that compressed gas discharged from a first cylinder cavity of the cylinder apparatus and then passing through the solenoid valve apparatus is collected and stored by the first circulation cavity, and a second cylinder cavity of the cylinder apparatus is charged with compressed gas stored in the second circulation cavity together with the compressed gas supplied from the solenoid valve apparatus. In this way, compressed gas discharged from the cylinder apparatus is collected and stored by the gas circulation apparatus, and the compressed gas stored by the gas circulation apparatus can also be used to fill the cylinder apparatus, thereby implementing recycling of compressed gas, saving a large amount of compressed gas, reducing the consumption of compressed gas, saving production costs and reducing expenses. Moreover, the gas circulation apparatus can be directly mounted in a gas circuit of the pneumatic apparatus through a quick connector without changing the original pneumatic apparatus (such as a pneumatic valve), to collect and recycle gas discharged from the cylinder apparatus, which is convenient and quick. In addition, mounting the gas circulation apparatus in the pneumatic apparatus also eliminates the costs of mounting a pressure relief valve, a silent valve, etc., and reduces the noise of pneumatic components.

In a further embodiment of this application, with reference to FIG. 13, a schematic flowchart of a gas circulation method according to embodiments of this application is shown. The method is applied to a gas circulation apparatus. The gas circulation apparatus is connected in series between a solenoid valve apparatus and a cylinder apparatus, and the gas circulation apparatus may include a valve core structure, a first circulation cavity, and a second circulation cavity. As shown in FIG. 13, the method may include the following operation.

At S1301, when the valve core structure moves in a first direction, the first circulation cavity is controlled to collect and store compressed gas discharged from a first cylinder cavity of the cylinder apparatus and then passing through the solenoid valve apparatus, and compressed gas stored in a second circulation cavity and the compressed gas supplied from the solenoid valve apparatus are controlled, to jointly charge a second cylinder cavity of the cylinder apparatus.

It needs to be noted that in addition to moving in the first direction, the valve core structure may also move in a second direction. Therefore, in some embodiments, the method may further include the following operation.

When the valve core structure moves in a second direction, the second circulation cavity is controlled to collect and store compressed gas discharged from the second cylinder cavity of the cylinder apparatus and then passing through the solenoid valve apparatus, and the compressed gas stored in the first circulation cavity and the compressed gas supplied from the solenoid valve apparatus are controlled, to jointly charge the first cylinder cavity of the cylinder apparatus.

The gas circulation apparatus further includes a connecting rod. In some embodiments, the method may further include the following operation.

When the valve core structure is driven by the connecting rod to move in the first direction responsive to that a first driving instruction is received, so that the gas circulation apparatus is in a first working state.

Or, the valve core structure is driven by the connecting rod to move in a second direction responsive to that a second driving instruction is received, so that the gas circulation apparatus is in a second working state.

Further, the gas circulation apparatus may further include a first gas recovery hole and a second gas recovery hole. In some embodiments, the method may further include the following operation.

When the gas circulation apparatus is in the first working state, the first gas recovery hole is controlled to guide the compressed gas discharged from the first cylinder cavity into the first circulation cavity through the solenoid valve apparatus; or, when the gas circulation apparatus is in the second working state, the second gas recovery hole is controlled to guide the compressed gas discharged from the second cylinder cavity into the second circulation cavity through the solenoid valve apparatus.

Further, the gas circulation apparatus may further include a first sealing structure and a second sealing structure, and the valve core structure may include a first piston and a second piston. In some embodiments, the operation that the valve core structure is driven by the connecting rod to move in the first direction responsive to that the first driving instruction is received may include the following operation.

The valve core structure is driven by the connecting rod to move in the first direction, to control the first piston to move to a position in which the first gas recovery hole is opened, and control the second piston to move to engage with the second sealing structure to close the second gas recovery hole.

Correspondingly, the operation that the valve core structure is driven by the connecting rod to move in a second direction responsive to that the second driving instruction is received may include the following operation.

The valve core structure is driven by the connecting rod to move in the second direction, to control the first piston to move to engage with the first sealing structure to close the first gas recovery hole, and control the second piston to move to a position in which the second gas recovery hole is opened.

Further, the valve core structure may further include a third piston and a fourth piston. In some embodiments, the operation that the valve core structure is driven by the connecting rod to move in the first direction responsive to that the first driving instruction is received may include the following operation.

The valve core structure is driven by the connecting rod to move in the first direction, to control the third piston to move to engage with the first sealing structure to divide the first circulation cavity into a first gas recovery cavity and a first gas passage, and control the fourth piston to move to a position in which a second gas recovery cavity and a second gas passage are combined into the second circulation cavity.

Correspondingly, the valve core structure is driven by the connecting rod to move in a second direction responsive to that the second driving instruction is received may include the following operation.

The valve core structure is driven by the connecting rod to move in the second direction, to control the third piston to move to a position in which the first gas recovery cavity and the first gas passage are combined into the first circulation cavity, and control the fourth piston to move to engage with the second sealing structure to divide the second circulation cavity into the second gas recovery cavity and the second gas passage.

The first gas passage is configured to communicate the first cylinder cavity with the solenoid valve apparatus, and the second gas passage is configured to communicate the second cylinder cavity with the solenoid valve apparatus.

In addition, in some embodiments, the method may further include that: when the valve core structure moves in the first direction, the piston rod of the cylinder apparatus is driven to move in a third direction; or when the valve core structure moves in the second direction, the piston rod of the cylinder apparatus is driven to move in a fourth direction.

It can be understood that the gas circulation method provided in the embodiments of this application and the gas circulation apparatus provided in the foregoing embodiments relate to the same inventive concept, have similar specific descriptions, and have similar beneficial effects as the method embodiments. The technical details not disclosed in the embodiments of the gas circulation method in this application can be understood with reference to the description in the embodiments of the gas circulation apparatus in this application.

The embodiments of this application provide a gas circulation method, applied to a gas circulation apparatus. The gas circulation apparatus is connected in series between a solenoid valve apparatus and a cylinder apparatus. The gas circulation apparatus may include a valve core structure, a first circulation cavity, and a second circulation cavity. When the valve core structure moves in a first direction, the first circulation cavity is controlled to collect and store compressed gas discharged from a first cylinder cavity of the cylinder apparatus and then passing through the solenoid valve apparatus, and compressed gas stored in the second circulation cavity and the compressed gas supplied from the solenoid valve apparatus are controlled to jointly charge a second cylinder cavity of the cylinder apparatus. In this way, compressed gas discharged from the cylinder apparatus is collected and stored by the gas circulation apparatus, and the compressed gas stored by the gas circulation apparatus can further be used to charge the cylinder apparatus, thereby implementing recycling of compressed gas, reducing compressed gas consumption, avoiding waste, and saving costs.

Figure 14:
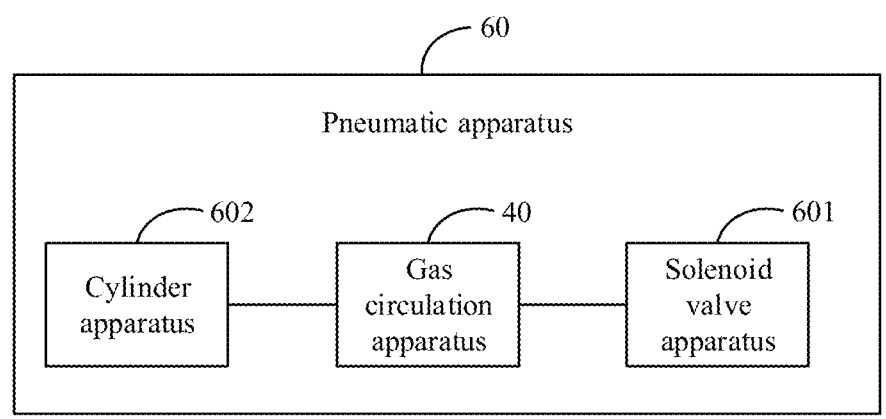
FIG. 14 is a schematic structural diagram illustrating the composition of a pneumatic apparatus according to embodiments of this application.

In still yet another embodiment of this application, with reference to FIG. 14, a schematic structural composition diagram of a pneumatic apparatus 60 according to embodiments of this application is shown. As shown in FIG. 14, the pneumatic apparatus 60 may include a cylinder apparatus 602, a solenoid valve apparatus 601, and the gas circulation apparatus 40 described in any of the foregoing embodiments.

Since the pneumatic apparatus 60 includes the foregoing gas circulation apparatus 40, compressed gas discharged from the cylinder apparatus is collected and stored by the gas circulation apparatus, and the compressed gas stored by the gas circulation apparatus can further be used to charge the cylinder apparatus, thereby implementing recycling of compressed gas, reducing compressed gas consumption, avoiding waste, and saving costs.

Figure 15:
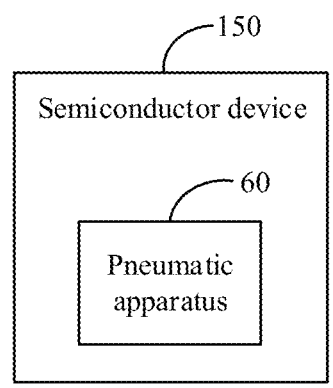
FIG. 15 is a schematic structural diagram illustrating the composition of a semiconductor device according to embodiments of this application.

In still yet another embodiment of this application, with reference to FIG. 15, a schematic structural diagram of the composition of a semiconductor device 150 according to embodiments of this application is shown. As shown in FIG. 15, the semiconductor device 150 includes the pneumatic apparatus 60 described in the foregoing embodiments.

Since the semiconductor device 150 includes the gas circulation apparatus 40, compressed gas discharged from the cylinder apparatus is collected and stored by the gas circulation apparatus, and the compressed gas stored by the gas circulation apparatus can further be used to charge the cylinder apparatus, thereby implementing recycling of compressed gas, reducing compressed gas consumption, avoiding waste, and saving costs.

The foregoing descriptions are merely preferred embodiments of this application, but are not intended to limit the scope of protection of this application.

It needs to be noted that, in this application, the terms "include", "comprise" or any other variants thereof are intended to cover non-exclusive inclusion, so that a process, method, article or apparatus that includes a series of elements includes not only those elements, but also other elements that are not explicitly listed or elements inherent to the process, method, article, or apparatus. If no more limitation is made, an element defined by the expression "including a . . . " does not exclude that the process, method, article, or apparatus that includes the element has other same elements.

The sequence numbers of the foregoing embodiments of this application are only for description, and do not represent the superiority or inferiority of the embodiments.

The methods disclosed in the several method embodiments provided by this application can be arbitrarily combined without causing conflicts so as to obtain new method embodiments.

The features disclosed in the several product embodiments provided by this application can be arbitrarily combined without causing conflicts so as to obtain new product embodiments.

The features disclosed in the several method or device embodiments provided by this application can be arbitrarily combined without causing conflicts so as to obtain new method or device embodiments.

The foregoing descriptions are only specific implementations of this application. However, the scope of protection of this application is not limited thereto. Any variation or substitution easily conceived by those skilled in the art within the technical scope of the disclosure should all fall within the scope of protection of this application. Therefore, the scope of protection of this application should be determined by the scope of protection of the appended claims.

What is claimed is:

1. A gas circulation apparatus, applied to a pneumatic apparatus comprising a solenoid valve apparatus and a cylinder apparatus, wherein the gas circulation apparatus is connected in series between the solenoid valve apparatus and the cylinder apparatus; the gas circulation apparatus comprises a valve core structure, a first circulation cavity, and a second circulation cavity; and
wherein the valve core structure is configured to move in a first direction, so that a compressed gas discharged from a first cylinder cavity of the cylinder apparatus and then passing through the solenoid valve apparatus is collected and stored by the first circulation cavity, and a second cylinder cavity of the cylinder apparatus is charged with a compressed gas stored in the second circulation cavity together with a compressed gas supplied from the solenoid valve apparatus.

2. The gas circulation apparatus of claim 1, wherein
the valve core structure is further configured to move in a second direction, so that the compressed gas discharged from the second cylinder cavity of the cylinder apparatus and then passing through the solenoid valve apparatus is collected and stored by the second circulation cavity, and the first cylinder cavity of the cylinder apparatus is charged with the compressed gas stored in the first circulation cavity together with the compressed gas supplied from the solenoid valve apparatus.

3. The gas circulation apparatus of claim 1, further comprising a connecting rod connected to the valve core structure, wherein
the connecting rod is configured to, drive the valve core structure to move in the first direction responsive to receiving a first driving instruction, so that the gas circulation apparatus is in a first working state; or,
the connecting rod is further configured to, drive the valve core structure to move in a second direction responsive to receiving a second driving instruction, so that the gas circulation apparatus is in a second working state.

4. The gas circulation apparatus of claim 3, further comprising a first gas recovery hole and a second gas recovery hole, the first gas recovery hole being arranged on a side wall of the first circulation cavity, and the second gas recovery hole being arranged on a side wall of the second circulation cavity; wherein
the first gas recovery hole is configured to guide the compressed gas discharged from the first cylinder cavity into the first circulation cavity through the solenoid valve apparatus when the gas circulation apparatus is in the first working state; and
the second gas recovery hole is configured to guide the compressed gas discharged from the second cylinder cavity into the second circulation cavity through the solenoid valve apparatus when the gas circulation apparatus is in the second working state.

5. The gas circulation apparatus of claim 4, wherein
the connecting rod is configured to drive the valve core structure to move in the first direction, and the valve core structure is stopped from moving when the valve core structure moves to a position in which the first gas recovery hole is opened and the second gas recovery hole is closed, so that the gas circulation apparatus is in the first working state; or,
the connecting rod is configured to drive the valve core structure to move in the second direction, and the valve core structure is stopped from moving when the valve core structure moves to a position in which the first gas recovery hole is closed and the second gas recovery hole is opened, so that the gas circulation apparatus is in the second working state.

6. The gas circulation apparatus of claim 4, further comprising a first sealing structure and a second sealing structure, wherein the first sealing structure is arranged on an inner side of the first circulation cavity, and the second sealing structure is arranged on an inner side of the second circulation cavity;
the valve core structure comprises a first piston and a second piston, the first piston is located in the first circulation cavity, and the second piston is located in the second circulation cavity; wherein
the valve core structure is further configured to, when moving in the first direction, control the first piston to move to a position in which the first gas recovery hole is opened, and control the second piston to move to engage with the second sealing structure to close the second gas recovery hole; or,
the valve core structure is further configured to, when moving in the second direction, control the first piston to move to engage with the first sealing structure to close the first gas recovery hole, and control the second piston to move to a position in which the second gas recovery hole is opened.

7. The gas circulation apparatus of claim 6, wherein the valve core structure further comprises a third piston and a fourth piston, the third piston being located in the first circulation cavity, and the fourth piston being located in the second circulation cavity; wherein
the valve core structure is further configured to, when moving in the first direction, control the third piston to move to engage with the first sealing structure to divide the first circulation cavity into a first gas recovery cavity and a first gas passage, and control the fourth piston to move to a position in which a second gas recovery cavity and a second gas passage are combined into the second circulation cavity; or,
the valve core structure is further configured to, when moving in the second direction, control the third piston to move to a position in which a first gas recovery cavity and a first gas passage are combined into the first circulation cavity, and control the fourth piston to move to engage with the second sealing structure to divide the second circulation cavity into a second gas recovery cavity and a second gas passage; and
wherein the first gas passage is configured to communicate the first cylinder cavity with the solenoid valve apparatus, and the second gas passage is configured to communicate the second cylinder cavity with the solenoid valve apparatus.

8. The gas circulation apparatus of claim 6, wherein the valve core structure further comprises a fifth piston and a sixth piston, the fifth piston being located in the first circulation cavity, and the sixth piston being located in the second circulation cavity; wherein
side walls of the first circulation cavity comprise the first piston and the fifth piston; and
side walls of the second circulation cavity comprise the second piston and the sixth piston.

9. The gas circulation apparatus of claim 6, wherein the valve core structure further comprises a fifth piston;
side walls of the first circulation cavity comprise the first piston and the fifth piston; and
the side walls of the second circulation cavity comprise the second piston and the fifth piston.

10. The gas circulation apparatus of claim 7, wherein the first gas passage comprises a first first-gas-hole and a first second-gas-hole, the first first-gas-hole is arranged on a side wall of the first circulation cavity close to the solenoid valve apparatus side, and the first second-gas-hole is arranged on a side wall of the first circulation cavity close to the first cylinder cavity side; and
the second gas passage comprises a second first-gas-hole and a second second-gas-hole, the second first-gas-hole is arranged on a side wall of the second circulation cavity close to the solenoid valve apparatus side, and the second second-gas-hole is arranged on a side wall of the second circulation cavity close to the second cylinder cavity side.

11. The gas circulation apparatus of claim 1, wherein the valve core structure is further configured to, when moving in the first direction, drive a piston rod of the cylinder apparatus to move in a third direction by the gas circulation apparatus; or when moving in a second direction, drive a piston rod of the cylinder apparatus to move in a fourth direction by the gas circulation apparatus.

12. A gas circulation method, applied to a gas circulation apparatus which is connected in series between a solenoid valve apparatus and a cylinder apparatus and comprises a valve core structure, a first circulation cavity, and a second circulation cavity, the method comprising:
controlling the first circulation cavity to collect and store a compressed gas discharged from a first cylinder cavity of the cylinder apparatus and then passing through the solenoid valve apparatus and controlling a compressed gas stored in the second circulation cavity together with a compressed gas supplied from the solenoid valve apparatus to jointly charge a second cylinder cavity of the cylinder apparatus, when the valve core structure moves in a first direction.

13. The method of claim 12, further comprising:
controlling the second circulation cavity to collect and store a compressed gas discharged from the second cylinder cavity of the cylinder apparatus and then passing through the solenoid valve apparatus and controlling the compressed gas stored in the first circulation cavity and the compressed gas supplied from the solenoid valve apparatus to jointly charge the first cylinder cavity of the cylinder apparatus, when the valve core structure moves in a second direction.

14. The method of claim 12, wherein the gas circulation apparatus further comprises a connecting rod, and the method further comprises:
driving, by the connecting rod, the valve core structure to move in the first direction responsive to that a first driving instruction is received, so that the gas circulation apparatus is in a first working state; or,
driving, by the connecting rod, the valve core structure to move in a second direction responsive to that a second driving instruction is received, so that the gas circulation apparatus is in a second working state.

15. The method of claim 12, wherein the gas circulation apparatus further comprises a first gas recovery hole and a second gas recovery hole, and the method further comprises:
controlling the first gas recovery hole to guide the compressed gas discharged from the first cylinder cavity into the first circulation cavity through the solenoid valve apparatus, when the gas circulation apparatus is in a first working state; or
controlling the second gas recovery hole to guide the compressed gas discharged from the second cylinder cavity into the second circulation cavity through the solenoid valve apparatus, when the gas circulation apparatus is in a second working state.

16. The method of claim 15, wherein the gas circulation apparatus further comprises a first sealing structure and a second sealing structure, and the valve core structure comprises a first piston and a second piston;

wherein said driving, by the connecting rod, the valve core structure to move in the first direction responsive to that the first driving instruction is received comprises:

driving, by the connecting rod, the valve core structure to move in the first direction, to control the first piston to move to a position in which the first gas recovery hole is opened, and control the second piston to move to engage with the second sealing structure to close the second gas recovery hole; and correspondingly, said driving, by the connecting rod, the valve core structure to move in the second direction responsive to that the second driving instruction is received comprises:

driving, by the connecting rod, the valve core structure to move in the second direction, to control the first piston to move to engage with the first sealing structure to close the first gas recovery hole, and control the second piston to move to a position in which the second gas recovery hole is opened.

17. The method of claim 15, wherein the valve core structure further comprises a third piston and a fourth piston;

said driving, by the connecting rod, the valve core structure to move in the first direction responsive to that the first driving instruction is received comprises:

driving, by the connecting rod, the valve core structure to move in the first direction, to control the third piston to move to engage with the first sealing structure to divide the first circulation cavity into a first gas recovery cavity and a first gas passage, and control the fourth piston to move to a position in which a second gas recovery cavity and a second gas passage are combined into the second circulation cavity;

correspondingly, said driving, by the connecting rod, the valve core structure to move in the second direction responsive to that the second driving instruction is received comprises:

driving, by the connecting rod, the valve core structure to move in the second direction, to control the third piston to move to a position in which the first gas recovery cavity and the first gas passage are combined into the first circulation cavity, and control the fourth piston to move to engage with the second sealing structure to divide the second circulation cavity into the second gas recovery cavity and the second gas passage; and wherein the first gas passage is configured to communicate the first cylinder cavity with the solenoid valve apparatus, and the second gas passage is configured to communicate the second cylinder cavity with the solenoid valve apparatus.

18. The method of claim 12, further comprising:

driving a piston rod of the cylinder apparatus to move in a third direction when the valve core structure moves in the first direction; or, driving a piston rod of the cylinder apparatus to move in a fourth direction when the valve core structure moves in a second direction.

19. A pneumatic apparatus, comprising a cylinder apparatus, a solenoid valve apparatus, and a gas circulation apparatus, wherein the gas circulation apparatus is connected in series between the solenoid valve apparatus and the cylinder apparatus; the gas circulation apparatus comprises a valve core structure, a first circulation cavity, and a second circulation cavity; and wherein the valve core structure is configured to move in a first direction, so that a compressed gas discharged from a first cylinder cavity of the cylinder apparatus and then passing through the solenoid valve apparatus is collected and stored by the first circulation cavity, and a second cylinder cavity of the cylinder apparatus is charged with a compressed gas stored in the second circulation cavity together with a compressed gas supplied from the solenoid valve apparatus.

20. The pneumatic apparatus of claim 19, wherein the valve core structure is further configured to move in a second direction, so that the compressed gas discharged from the second cylinder cavity of the cylinder apparatus and then passing through the solenoid valve apparatus is collected and stored by the second circulation cavity, and the first cylinder cavity of the cylinder apparatus is charged with the compressed gas stored in the first circulation cavity together with the compressed gas supplied from the solenoid valve apparatus.

* * * * *